United States Patent [19]

Nakamura et al.

[11] Patent Number: 5,100,722
[45] Date of Patent: Mar. 31, 1992

[54] GLASS FIBER-REINFORCED RESIN COMPOSITE MATERIALS

[75] Inventors: Michio Nakamura; Hajime Takeuchi; Masahide Takahashi, all of Kanagawa; Yasuki Matsuo; Hiromitu Kimura, both of Gunma; Takumi Itani, Chiba, all of Japan

[73] Assignees: Nichias Corporation; Kanebo, Ltd., both of Tokyo, Japan

[21] Appl. No.: 436,488

[22] Filed: Nov. 14, 1989

[30] Foreign Application Priority Data

Nov. 25, 1988 [JP] Japan .................................. 63-297540

[51] Int. Cl.$^5$ ........................ B32B 15/04; B32B 17/04
[52] U.S. Cl. .................................. 428/263; 428/268; 428/273; 428/421; 428/422; 428/448

[58] Field of Search ............... 428/448, 480, 422, 246, 428/260, 268, 273, 901, 263, 421

[56] References Cited

U.S. PATENT DOCUMENTS 4,898,786 2/1990 Swofford ........................ 428/448 X
4,939,035 7/1990 Swofford ........................ 428/448 X Primary Examiner—Thomas J. Herbert, Jr.
Attorney, Agent, or Firm—Flynn, Thiel, Boutell & Tanis

[57] ABSTRACT

A fiber-reinforced resin composite material suitable for printed circuit boards, etc., in which an inorganic fiber material is treated on its surface with a fluorosilane coupling agent and then impregnated with a fluororesin material.

6 Claims, 1 Drawing Sheet

GLASS FIBER-REINFORCED RESIN COMPOSITE MATERIALS

BACKGROUND OF THE INVENTION

1. Field of the Invention

The present invention relates to an improvement in fiber-reinforced resin composite materials used as printed circuit boards for electronic equipment, etc.

2. Statement of the Prior Art

Heretofore, laminated sheets obtained by the hot-pressing lamination of a predetermined number of resin-impregnated sheetings formed by impregnating glass cloth with a fluororesin and melting it by heating have been used for electrical purposes. For such laminated sheets, laminated sheets obtained by the deposition of greige goods onto said glass cloth are disclosed in Japanese Patent Laid-Open (Kokai) Publication Nos. 60(1985)-240743 and 62(1987)-161538.

Use of such greige goods-deposited glass cloth gives laminated sheets having a reduced or limited degree of water absorption and an increased insulation resistance after hygroscopic treatments.

Originally, the above greige goods have been used for the purpose of bonding monofilaments together when preparing glass fibers by putting them into yarn or strand. Generally used for this are polyvinyl alcohol, starch, fats and oils, etc.

However, later studies have revealed that said greige goods have an adverse influence mainly upon insulation resistance and offer problems such as a lowering of moisture absorption resistance and carbonization of fluororesins during firing. In order to provide a solution to such problems, it is now under investigation to use cloth from which the above greige goods are removed by heat cleaning or wet washing or to treat such cloth with various coupling agents such as those based on silanes, chromium and titanium. A coupling treatment with an aminosilane is now found to be especially preferred for a composite material comprising a combination of inorganic fiber materials with fluororesins. Indeed, such a composite material is on practical levels in wide applications.

However, there is left much to be desired for the above composite material comprising a combination of inorganic fiber materials with fluororesins, since it is still less than satisfactory in terms of moisture absorption resistance so that its insulation resistance is likely to drop due to moisture absorption.

SUMMARY OF THE INVENTION

A primary object of the present invention is to impart much higher moisture absorption resistance to a composite material of the above structure.

Another object of the present invention is to provide a fiber-reinforced resin composite material best-suited for use in printed circuit boards.

It has now been found that the reasons that the fiber-reinforced resin composite material of the above structure is poor in moisture absorption resistance are that:

(1) Glass cloth is formed of yarn obtained by twising a tow of 50 to 1600 fibers of 3 to 13 $\mu$m in filament diameter. For that reason, a fluororesin is hardly impregnated into monofilaments bundled up into yarn. In other words, the fluororesin to be impregnated into glass cloth is supplied in the form of an aqueous dispersion, but it is filtered off on the outside of the yarn because of its average particle size being between 0.2 $\mu$m and 0.3 $\mu$m, so that its impregnation into the monofilaments is insufficient.

(2) Close adhesion of yarn to fluororesins or partly impregnated fluororesins to monofilaments is inadequate.

As a result of extensive experiments and studies made so as to solve the above problems, it has been found that if a glass cloth is subjected to heat cleaning for the removal of greige goods deposited thereonto and then treated on its surface with a fluorosilane coupling agent, it is then possible to reduce or limit the hygroscopic action, even though the impregnation of a fluororfesin into the yarn is insufficient. Such findings underlie the present invention.

More specifically, the present invention relates to a fiber-reinforced resin composite material comprising an inorganic fiber material impregnated with a fluororesin, characterized in that said inorganic fiber material is treated on its surface with a fluorosilane coupling agent.

The hygroscopic action of the fiber-reinforced resin composite material of the above structure is reduced or limited by the fluorosilane coupling agent, even though the impregnation of the fluororesin into glass yarn is insufficient, since the inorganic fiber material has been treated on its surface with the fluorosilane coupling agent.

The fluorine atom of the fluorosilane coupling agent is so compatible with (affinity to) the fluororesin to be impregnated that the adhesion of the fluororesin to the inorganic fiber material is further improved.

BRIEF DESCRIPTION OF THE DRAWING

The above and other objects and features of the present invention will become apparent from a reading of the following detailed description with reference to the accompanying drawing, which is given for the purpose of illustration alone and in which.

DETAILED DESCRIPTION OF THE INVENTION

Figure 1:
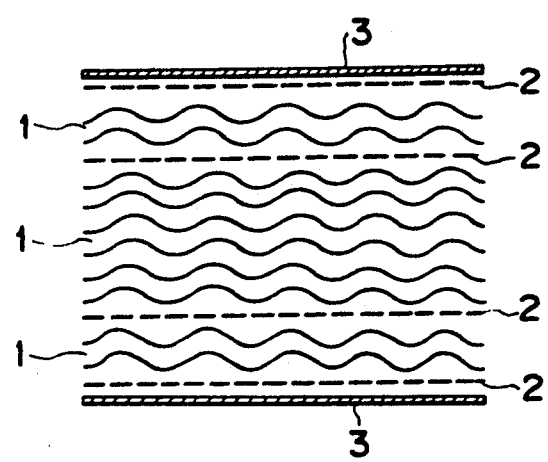
FIGS. 1 and 2 are schematic views illustrative of the present invention applied to laminated sheets for electrical purposes.

As the inorganic fiber material used for the fiber-reinforced resin composite material according to the present invention, it is desired to use cloth obtained by plain weaving of yarn having a composition generally referred to as E-glass, but the present invention is not limited thereto. For instance, use may be made of inorganic fibers usually known as insulating materials such as quartz glass, D-glass and alumina fibers, which may be used alone or in the form of union yarn or twisted yarn. Additionally, the inorganic fiber material may be used in non-restrictive forms including woven or knitted fabrics, unidirectionally orientated yarn, mat or alternative laminates thereof.

In order to form the fiber-reinforced resin composite material according to the present invention, the inorganic fiber material is first rid of greige goods or binder deposits by heat cleaning or washing with warm water, and is then treated with the fluorosilane coupling agent in a conventional manner. To this end, the coupling agent may be applied or sprayed directly onto the inorganic fiber material. Alternatively, it may be treated with a solution of the coupling agent dissolved in water or a solvent, followed by the removal of excess water or solvent by heating or under reduced pressure. Most frequently, however, the inorganic fiber material is immersed in an aqueous solution of the coupling agent hydrolyzed by an aqueous solution of weak acidity, followed by drying at 70° to 200° C.

The aforesaid fluorosilane coupling agents used may be a silane coupling agent containing in its molecule at least one fluorine atom, typically a trifluorosilane expressed by the following general formula(1) or a perfluorosilane expressed by the following general formula (2).

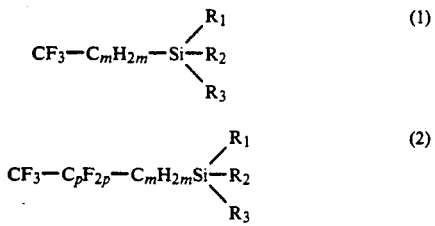

wherein $R_1$, $R_2$ and $R_3$ are each $C_nH_{2n+1}$ or $OC_nH_{2n+1}$ provided that n=1 to 5 or Cl; m=0 to 9; and p=1 to 9.

Most suitably, the amount of the fluorosilane coupling agent to be deposited is in a range of 0.2 to 2.0% by weight. It is understood that surface active agents or other additives may be added to the liquid fluorosilane coupling agent or its aqueous solution.

The thus obtained surface-treated inorganic fiber material is impregnated with a fluororesin dispersion, and is heated at 270° to 400° C. to melt the resin. A resin-impregnated sheeting containing a predetermined amount of the resin is obtained by repeating such impregnation/melting-by-heating, if required.

The above resin-impregnated sheeting may be used to make a laminated sheet for electrical purposes. To this end, a given number of the resin-impregnated sheetings obtained as mentioned above are put one upon another with fluororesin films, and the resulting assembly is laminated on one or both sides with a metal foil or foils, such as a copper foil or foils, and then hot-pressed at a pressure of 3 to 130 kg/cm² and a temperature of 270° to 400° C. for 3 to 200 minutes into a laminated sheet.

As the fluororesin dispersions, use may be made of those of ethylene tetrafluoride resins (PTFE), ethylene tetrafluoride/propylene hexafluoride copolymer resins (FEP), ethylene tetrafluoride/perfluoroalkyl vinyl ether copolymer resins (PFA) and so on.

As the fluororesin films to be used with the above resin-impregnated sheetings, use may be made of, e.g., PTFE, FEP and PFA films.

When the inorganic fiber material is impregnated with the fluororesin dispersion, it is difficult to obtain a resin-impregnated sheeting of even thickness, since the fluororesin dispersion is likely to vary in the concentration of solid matter from lot to lot or fluctuate in viscosity due to temperature or changes-with-time, so that there is a variation in the amount of the resin impregnated in the inorganic fiber material. However, a laminated sheet of uniform thickness for electrical purposes can be easily obtained by increasing or decreasing the number of the fluororesin films to be used depending upon the thickness of the resin-impregnated sheeting.

For laminated sheets for electrical purposes in particular, even thickness and a uniform dielectric constant are strongly demanded and have to be satisfied at the same time. In the use of the resin-impregnated sheetings, variations in its thickness give rise to variations in the resin content and hence dielectric constant of the laminated sheet. However, the use of the fluororesin films prevents such problems from arising.

After impregnation with the fluororesin dispersion and melting-by-heating, the inorganic fiber material may further be impregnated with an additional dispersion of an ethylene tetrafluoride/propylene hexafluoride copolymer resin (FEP) or an ethylene tetrafluoride/perfluoroalkyl vinyl ether copolymer resin (PFA), followed by melting-by-heating.

The resin-impregnated sheetings which, as mentioned above, are additionally impregnated with the FEP or PFA dispersion and melted by heating, show improved adhesion to each other or to the PTFE films and are thus much more improved in terms of moisture absorption resistance. With FEP or PFA, improved adhesion is obtained by hot-pressing due to their melt flowability.

EXAMPLES AND COMPARATIVE EXAMPLES

Example 1

After the removal of greige goods, etc. by heat cleaning, a glass cloth of 0.05 mm in thickness was immersed in an aqueous solution containing 2% by weight of the fluorosilane coupling agent—$CF_3CH_2CH_2Si(OCH_3)_3$—, passed between squeeze rolls and dried at 110° C. to obtain a surface-treated glass cloth. The amount of the fluorosilance coupling agent deposited was regulated to 0.8% by weight, as measured after drying, by the adjustment of the squeeze rolls.

The thus obtained glass cloth was impregnated with a dispersion of ethylene tetrafluoride resin and then melted by heating at 370° C. After this impregnation/melting-by-heating operation was repeated four times, it was further impregnated with an additional dispersion of FEP and then melted by heating at 340° C. to obtain a resin-impregnated sheeting having a resin content of 68%.

Ten (10) such resin-impregnated sheetings, four ethylene tetrafluoride resin films of 25 μm in thickness and two copper foils of 18 μm in thickness were put one upon another, as shown in FIG. 1, and the assembly was then hot-pressed at a pressure of 70 kg/cm² and a temperature of 380° C. for 90 minutes to obtain a 0.8 mm-thick laminated sheet for electrical purposes.

In FIG. 1, reference numerals 1, 2 and 3 stand for resin-impregnated sheetings, ethylene tetrafluoride films and copper foils, respectively.

The laminated sheet obtained by the above process was immersed in boiling water of 100° C. for 2 hours (D-2/100 treatment) according to JIS C 6481 to determine its insulation resistance and water absorption. The results are set forth in Table 1.

Comparative Example 1

A glass cloth with greige goods deposited onto it, not subjected to heat cleaning and treatment with the fluorosilane coupling agent, was used. Under otherwise identical conditions, Example 1 was repeated. The results of measurement of the obtained laminated sheet are set forth in Table 1.

Comparative Example 2

A glass cloth, from which greige goods were removed by heat cleaning (but which was not treated with the fluorosilane coupling agent) was used. Under otherwise identical conditions, Example 1 was repeated.

The results of measurement of the obtained laminated sheet are set forth in Table 1.

Comparative Example 3

A glass cloth, subjected to heat cleaning and then treated on its surface with vinyltrimethoxysilane—$CH_2=CHSi(OCH_3)_3$—(at a deposition amount of 0.3% by weight), was used. Under otherwise identical conditions, Example 1 was repeated. The results of measurement of the obtained laminated sheet are set forth in Table 1.

Comparative Example 4

A glass cloth, subjected to heat cleaning and then treated on its surface with γ-aminopropyltriethoxysilane—$NH_2C_3H_8Si(OC_2H_5)_3$—(at a deposition amount of 0.3% by weight), was used. Under otherwise identical conditions, Example 1 was repeated. The results of measurement of the obtained laminated sheet are set forth in Table 1.

Example 2

After the removal of greige goods, etc. by heat cleaning, a glass cloth of 0.05 mm in thickness was immersed in an aqeuous solution containing 4% by weight of the fluorosilane coupling agent—$CF_3CH_2CH_2Si(OCH_3)_3$—, passed between squeeze rolls and dried at 120° C. to obtain a surface-treated glass cloth. The amount of the fluorosilance coupling agent deposited, as measured after drying, was regulated by the adjustment of the squeeze rolls.

The thus obtained glass cloth was impregnated with a dispersion of ethylene tetrafluoride resin and then melted by heating at 370° C. After this impregnation/-melting-by-heating operation was repeated four times, it was further impregnated with an additional dispersion of FEP and then melted by heating at 340° C. to obtain a resin-impregnated sheeting having a resin content of 67%.

Figure 2:
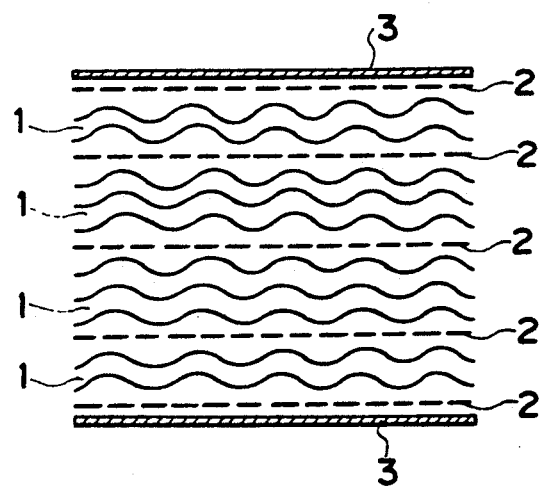

Ten (10) such resin-impregnated sheetings, five ethylene tetrafluoride resin films of 25 μm in thickness and two copper foils of 18 μm in thickness were put one upon another, as shown in FIG. 2, and the assembly was then hot-pressed at a pressure of 50 kg/cm² and a temperature of 400° C. for 60 minutes to obtain a 0.8 mm-thick laminated sheet for electrical purposes. In FIG. 2, the same as in FIG. 1 holds.

The laminated sheet obtained by the above process was immersed in boiling water of 100° C. for 2 hours (D-2/100 treatment) according to JIS C 6481 to determine its insulation resistance and water absorption. The results are set forth in Table 2.

TABLE 1

|  | Ex. 1 | Comp. Ex. 1 | 2 | 3 | 4 |
| --- | --- | --- | --- | --- | --- |
| Insulation Resistance After Boiling (Ω) | $5 \times 10^{14}$ | $7 \times 10^7$ | $4 \times 10^7$ | $2 \times 10^8$ | $6 \times 10^9$ |
| Water Absorption After Boiling (%) | 0.004 | 0.12 | 0.14 | 0.12 | 0.12 |

TABLE 2

| Example 2 | | | | | | | | |
| --- | --- | --- | --- | --- | --- | --- | --- | --- |
| (A) | 0.05 | 0.1 | 0.3 | 0.5 | 1.0 | 1.5 | 2.0 | 2.5 |
| (B) | $5 \times 10^9$ | $8 \times 10^{10}$ | $2 \times 10^{13}$ | $1 \times 10^{14}$ | $6 \times 10^{14}$ | $4 \times 10^{14}$ | $2 \times 10^{14}$ | $3 \times 10^{13}$ |
| (C) | 0.020 | 0.010 | 0.010 | 0.004 | 0.004 | 0.004 | 0.004 | 0.008 |

(A) Amount of the fluorosilane coupling agent deposited (wt. %).
(B) Insulation resistance after boiling (Ω).
(C) Water absorption after boiling (%).

As mentioned above, the present invention provides a fiber-reinforced resin composite material comprising an inorganic fiber material impregnated with a fluororesin, wherein said inorganic fiber material is treated on its surface with a fluorosilane coupling agent. The moisture absorption of the present composite material is reduced or limited by the water repllency of said fluorosilane coupling agent, even though the impregnation of the fluororesin into the yarn of the inorganic fiber material is insufficient. At the same time, the adhesion of the fluororesin to the inorganic fiber material is made firmer by said fluorosilane coupling agent. Thus, the present fiber-reinforced resin composite material is much improved in terms of moisture absorption resistance over conventional glass cloth laminated sheets impregnated with fluororesin dispersions.

According to the present invention, it is particularly easy to obtain laminated sheets for electrical purposes, for which both even thickness and a uniform dielectric constant are required.

What is claimed is

1. A laminated sheet comprising a plurality of resin-impregnated sheetings and fluororesin films which are placed one upon another to form a resultant assembly and at least one metal foil laminated to one or both sides of the resultant assembly by hot pressing, each of said resin-impregnated sheetings comprising a glass cloth impregnated with a fluororesin, said glass cloth having been treated on its surface with a fluorosilane coupling agent before said fluororesin is impregnated therein and heated after impregnation with said fluororesin to melt said fluororesin therein.

2. A fiber-reinforced resin composite material comprising an inorganic fiber material impregnated with a fluororesin, said inorganic fiber material being selected from the group consisting of glass fibers and alumina fibers and having been treated on its surface with a fluorosilane coupling agent before said fluororesin is impregnated therein.

3. A fiber-reinforced resin composite material used as laminated sheets for electrical purposes, said composite material comprising a plurality of resin-impregnated sheetings and fluororesin films placed one upon another, each of said resin-impregnated sheeting being obtained by treating the surface of a glass cloth with a fluorosilane coupling agent; impregnating said glass cloth with a fluororesin dispersion, melting said fluororesin by heating; and further impregnating the thus treated glass cloth with a dispersion of an ethylene tetrafluoride/propylene hexafluoride copolymer resin or an ethylene tetrafluoride/perfluoroalkyl vinyl ether copolymer resin, followed by melting by heating to form a resultant assembly, and providing on one or both sides of the resultant assembly a metallic foil or foils, followed by hot-pressing.

4. A fiber-reinforced resin composite material comprising a glass fiber material which has been cleaned to remove greige and binder deposits therefrom, surface-treated with a fluorosilane coupling agent such that an amount of from 0.2 to 2% by weight of said coupling agent is deposited on the surface of said glass fiber material and impregnated with a fluororesin, said fluororesin being melted at a temperature of from 270° to 400° C. after being impregnated into said glass material.

5. A fiber-reinforced resin composite material according to claim 4, wherein said fluorosilane coupling agent is a compound of either formula (1):

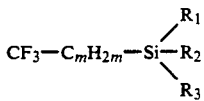

or formula (2):

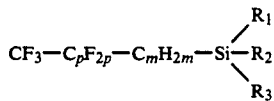

wherein $R_1$, $R_2$ and $R_3$ are each $C_nH_{2n+1}$, $OC_nH_{2n+1}$, with n equal to an integer from 1 to 5, or Cl; m equal to 0 or an integer from 1 to 9; and p equal to an integer from 1 to 9.

6. A fiber-reinforced resin composite material according to claim 4, wherein said fluororesin is a resin selected from the group consisting of ethylene tetrafluoride resins, ethylene tetrafluoride/propylene hexafluoride copolymer resins and perfluoroalkyl vinyl ether copolymer resins.

* * * * *